(12) United States Patent
Choi

(10) Patent No.: US 8,422,325 B2
(45) Date of Patent: Apr. 16, 2013

(54) PRECHARGE CONTROL CIRCUIT AND INTEGRATED CIRCUIT INCLUDING THE SAME

(75) Inventor: Jea Won Choi, Gongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 149 days.

(21) Appl. No.: 13/154,490

(22) Filed: Jun. 7, 2011

(65) Prior Publication Data

US 2011/0299350 A1   Dec. 8, 2011

(30) Foreign Application Priority Data

Jun. 7, 2010  (KR) .................. 10-2010-0053291
Jun. 3, 2011  (KR) .................. 10-2011-0053663

(51) Int. Cl.
*G11C 7/00* (2006.01)
*G11C 5/14* (2006.01)

(52) U.S. Cl.
USPC ....... 365/203; 365/189.09; 365/191; 365/196

(58) Field of Classification Search ................ 365/191, 365/196, 189.09, 203
See application file for complete search history.

(56) References Cited

U.S. PATENT DOCUMENTS

| | | | |
|---|---|---|---|
| 5,748,536 A * | 5/1998 | Kwon et al. | 365/185.25 |
| 2004/0145934 A1* | 7/2004 | Arsovski et al. | 365/49 |
| 2006/0120179 A1* | 6/2006 | Hwang et al. | 365/189.11 |

FOREIGN PATENT DOCUMENTS

KR   1020000013392 A   3/2000

* cited by examiner

*Primary Examiner* — Ly D Pham
(74) *Attorney, Agent, or Firm* — William Park & Associates Ltd.

(57) ABSTRACT

A precharge control circuit includes a precharge voltage supply unit for generating a precharge voltage according to a voltage level of a precharge control signal, a voltage generator for generating an operating voltage for controlling the voltage level of the precharge control signal in response to a first enable signal and a voltage control signal, and a signal generator for fixing the precharge control signal to a specific voltage level in response to a second enable signal and for linearly changing the voltage level of the precharge control signal according to a slope, determined by a level of the operating voltage, when the second enable signal is disabled.

6 Claims, 8 Drawing Sheets

PRECHARGE CONTROL CIRCUIT AND INTEGRATED CIRCUIT INCLUDING THE SAME

CROSS-REFERENCE TO RELATED APPLICATION

Priority to Korean patent application number 10-2010-0053291 filed on Jun. 7, 2010 and priority to Korean patent application number 10-2011-0053663 filed on Jun. 3, 2011, the entire disclosure of which are incorporated by references herein, are claimed.

BACKGROUND

Exemplary embodiments relate generally to an integrated circuit, and more particularly to a precharge control circuit and an integrated circuit including the same.

A nonvolatile memory device retains data stored in the device even in absence of power supply.

The data in a nonvolatile memory device is programmed or erased through F-N tunneling. More specifically, a floating gate is accumulated with electrons through a program operation, and the electrons accumulated in the floating gate are discharged toward the substrate through an erase operation. The threshold voltage of a memory cell may vary according to the amount of electrons accumulated in the floating gate, and the data can be determined by detecting the level of threshold voltage in a read operation.

FIG. 1 shows the general layout of a memory cell array of a semiconductor memory device.

Referring to FIG. 1, the memory cell array 100 of the semiconductor memory device includes a plurality of memory blocks BK. Each memory blocks BK includes a plurality of cell strings, and a plurality of memory blocks BK may be arranged in rows, e.g., in parallel from top to bottom as shown in FIG. 1, such that columns of the corresponding cell strings can also be formed (that is, the cell strings in each column come from different rows of memory block).

Each column of cell strings is coupled to one of the bit lines BL. Therefore, the length of a bit line would increase with more rows of memory blocks BK.

In general, a bit line is precharged or discharged when a program or read operation is performed in the semiconductor memory device. When the bit line length is elongated too long, the time it would take to precharge or discharge a bit line would become undesirably lengthy. Furthermore, when a power supply voltage is provided at once to precharge the bit line, it would cause the peak current to rise, which may negatively affect the operations of other circuits.

This type of precharge problem is not just limited to the bit line operations, but it may also occur in an integrated circuit having a too heavy load on lines that must be precharged.

BRIEF SUMMARY

Exemplary embodiments relate to a semiconductor memory device capable of reducing a peak current, generated in a precharge operation, by controlling a control signal so that a precharge voltage is slowly supplied to a precharge circuit.

A precharge control circuit according to an aspect of the present disclosure includes a precharge voltage supply unit for generating a precharge voltage according to a voltage level of a precharge control signal, a voltage generator for generating an operating voltage for controlling the voltage level of the precharge control signal in response to a first enable signal and a voltage control signal, and a signal generator for fixing the precharge control signal to a specific voltage level in response to a second enable signal and for linearly changing the voltage level of the precharge control signal according to a slope, determined by a level of the operating voltage, when the second enable signal is disabled.

An integrated circuit according to another aspect of the present disclosure includes a precharge voltage circuit for providing a precharge voltage changed according to a voltage level of a precharge control signal, a precharge control circuit for changing the voltage level of the precharge control signal in order to linearly change a level of the precharge voltage in response to first and second enable signals and a voltage control signal, and a control logic for generating the first and the second enable signals for a precharge operation and generating the voltage control signal according to a change of ambient temperature and a power supply voltage.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
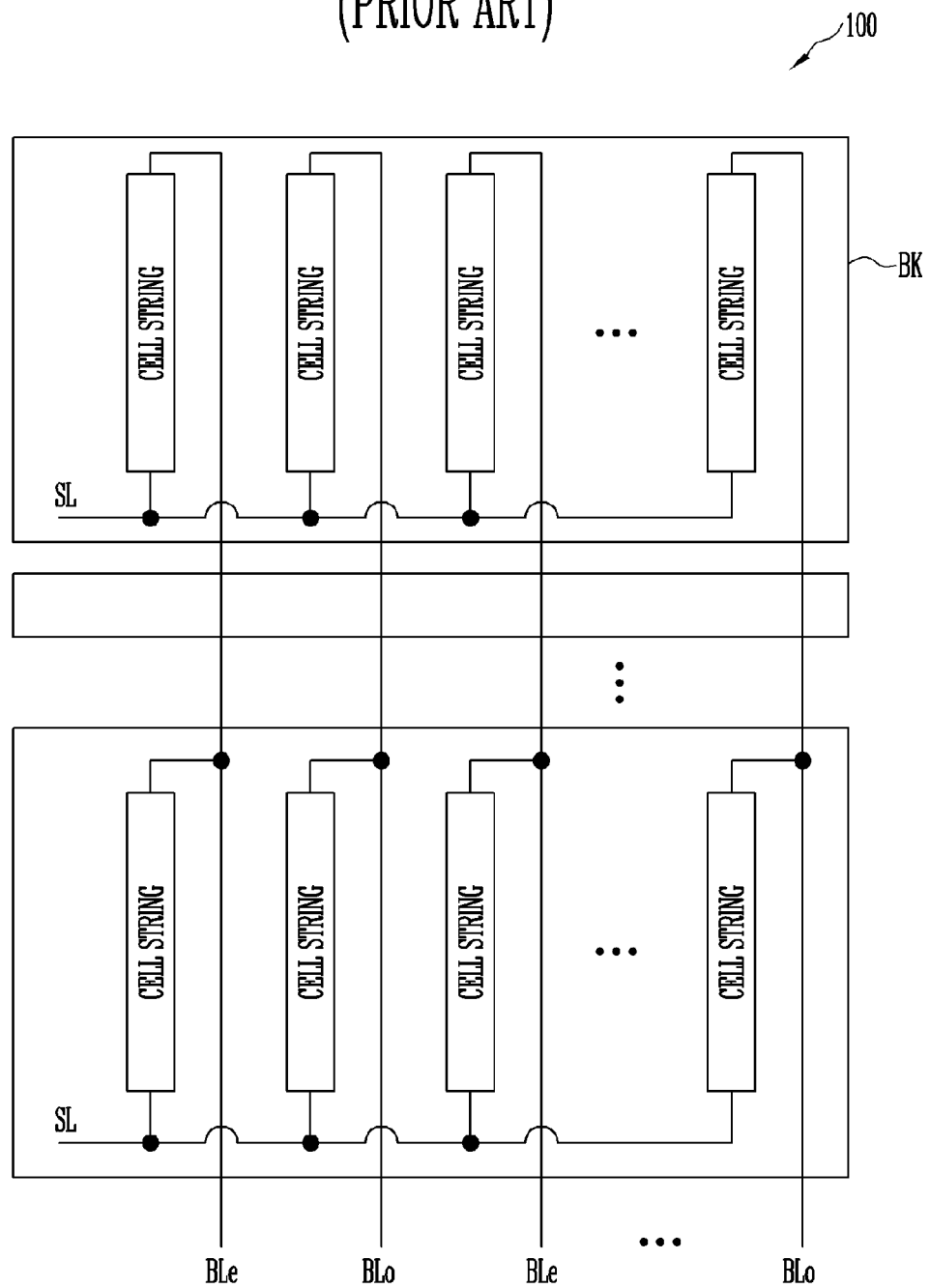
FIG. 1 is a diagram illustrating the conventional structure of a memory cell array of a semiconductor memory device.
Figure 2:
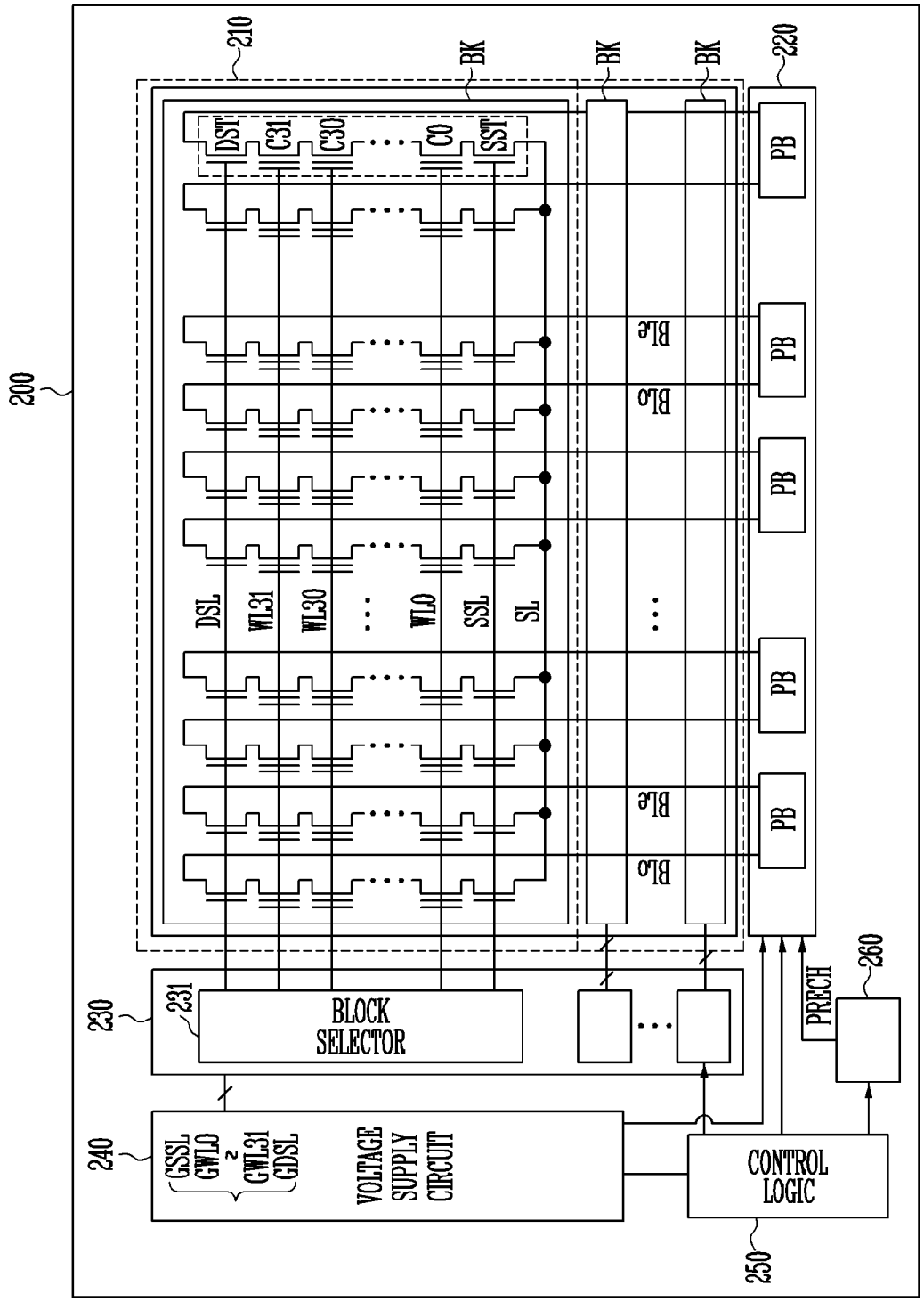
FIG. 2 is a diagram illustrating a semiconductor memory device.

Referring to FIG. 2, the semiconductor memory device 200 according to an embodiment of the present invention includes a memory cell array 210, a page buffer group 220, an X decoder 230, a voltage supply circuit 240, a control logic 250, and a precharge control circuit 260.

The memory cell array 210 includes a plurality of memory blocks BK arranged in rows as shown in FIG. 2. Each memory block includes a plurality of cell strings.

Each cell string includes a drain select transistor DST and a source select transistor SST. In each cell string, a plurality of memory cells C0, C1, C2, to C31 are coupled in series between the drain select transistor DST and the source select transistor SST.

The gate of the drain select transistor DST is coupled to a drain select line DSL, and the drain of the drain select transistor DST is coupled to a corresponding bit line. The bit lines of FIG. 2 are divided into even bit lines BLe and odd bit lines BLo.

The gate of a source select transistor SST is coupled to a source select line SSL, and the source of the source select transistor SST is coupled to a common source line SL.

The gates of memory cells C0, C1, C2 to C31 in each cell string are coupled to word lines WL0, WL1, WL2, to WL31, respectively.

Furthermore, as shown in FIG. 2, the cell strings in the memory blocks BK arranged in rows are arranged such that the corresponding cell strings—one from each row—form a column of cell strings where each column of cell strings is coupled to a corresponding bit line BL.

Figure 3:
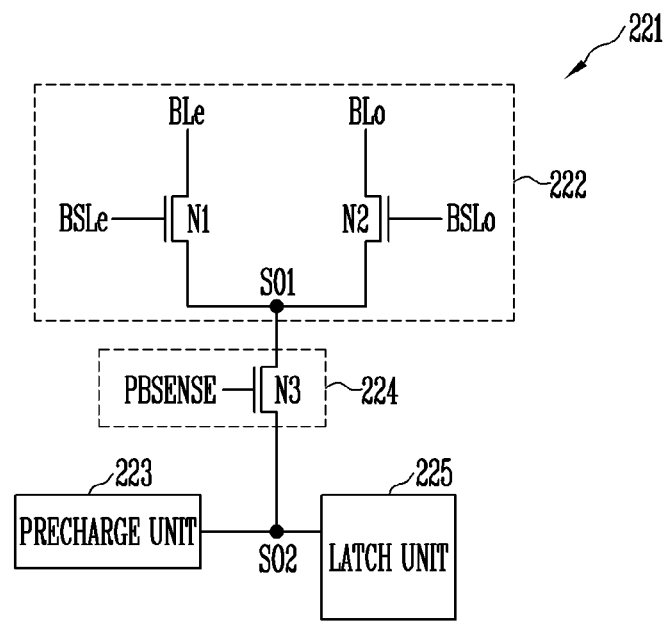
FIG. 3 is a circuit diagram of a page buffer shown in FIG. 2.

The page buffer group 220 includes a plurality of page buffers PB (where FIG. 3 shows a page buffer PB 221 in more detail). Each of the page buffers 221 is coupled to one or more bit lines. The page buffer 221 of the semiconductor memory device 200 according to an embodiment as shown in FIG. 2 is coupled to a bit line pair of even and odd bit lines BLe, BLo.

Referring to FIGS. 2-3, each page buffer PB 221 temporarily stores data to be programmed into specific memory cells or stores data read from specific memory cells.

Referring back to FIG. 2, the X decoder 230 includes a plurality of block selectors 231. Each one of the block selectors 231 is coupled to the respective one of the memory blocks BK in the memory cell array 210.

The block selector 231 couples the global drain select line GDSL, the global source select line GSSL, and the global word lines GWL0, GWL1, GWL2 to GWL31 of the voltage supply circuit 240 to the drain select line DSL, the source select line SSL, and the word lines WL0, WL1, WL2 to WL31 of the memory block BK in response to a control signal generated by the control logic 250.

The voltage supply circuit 240 generates operating voltages (such as a read voltage Vread, a program voltage Vpgm, a pass voltage Vpass, etc.) and provides the operating voltages to the global drain select line GDSL, the global source select line GSSL, and the global word lines GWL0, GWL1, GWL2 to GWL31, in response to a control signal generated by the control logic 250.

The control logic 250 generates control signals for controlling various operations including the program, read, and erase operations of the semiconductor memory device 200.

The precharge control circuit 260 generates a precharge control signal PRECH to be inputted to the page buffer group 220.

FIG. 3 is a circuit diagram of the page buffer 221 shown in FIG. 2.

The page buffers 221 of the page buffer group 220 are operated to precharge the even bit lines BLe or the odd bit lines BLo.

Referring to FIG. 3, the page buffer 221 includes a bit line selection unit 222, a precharge unit 223, a sense unit 224, and a latch unit 225.

The bit line selection unit 222 selects either the even bit line BLe or the odd bit line BLo. The selected bit line BLe or BLo is coupled to a first sense node SO1.

The bit line selection unit 222 includes first and second NMOS transistors N1 and N2. The first NMOS transistor N1 is coupled between the even bit line BLe and the first sense node SO1, and the second NMOS transistor N2 is coupled between the odd bit line BLo and the first sense node SO1. An even bit line select signal BSLe is inputted to the gate of the first NMOS transistor N1, and an odd bit line select signal BSLo is inputted to the gate of the second NMOS transistor N2.

The sense unit 224 changes the voltage of a second sense node SO2 according to the voltage of a bit line coupled to the first sense node SO1. The sense unit 224 includes a third NMOS transistor N3. The third NMOS transistor N3 is coupled between the first and second sense nodes SO1, SO2. A sense signal PBSENSE is inputted to the gate of the third NMOS transistor N3.

The precharge unit 223 precharges the second sense node SO2 so as to precharge the even bit line BLe or the odd bit line BLo through the first sense node SO1 coupled to the second sense node SO2.

Figure 4:
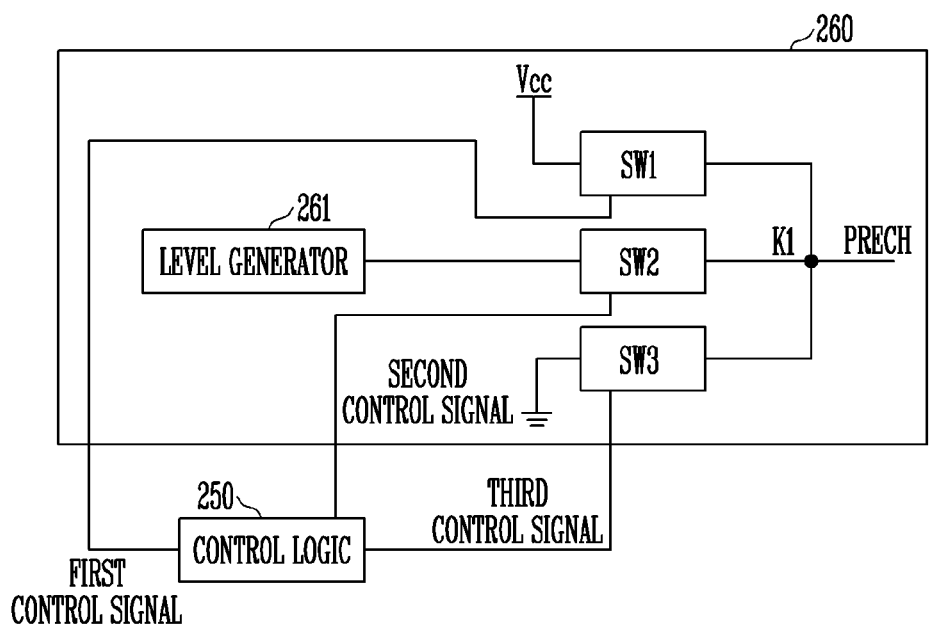
FIG. 4 is a circuit diagram of a precharge control circuit for precharging a bit line in stages.

Now referring to FIGS. 3-4, the precharge unit 223 may include a PMOS transistor (not shown) that is coupled between a terminal for a power supply voltage Vcc and the second sense node SO2. The precharge control signal PRECH (refer to FIG. 4 showing the precharge control circuit 260) is inputted to the PMOS transistor (not shown) of the precharge unit 223. The degree of the PMOS transistor (not shown) of the precharge unit 223 being turned on is controlled by the precharge control signal PRECH from the precharge control circuit 260, so that the bit line precharging operation is controlled through the second sense node SO2.

Referring back to FIG. 3, the latch unit 225 temporarily stores the data to be programmed to or the data read from the specific memory cells.

As described above, the memory blocks BK arranged in rows share the bit lines BLe, BLo. Accordingly, with increasing number of memory blocks BK, the length of the even bit line BLe and the odd bit line BLo will increase, and the load on the bit lines to be precharged will also increase.

When a bit line having a heavy load as described above is precharged, the problem associated with increased peak current may develop. This problem is not associated only with the bit line precharging operations of the semiconductor memory device. If a precharge circuit included in an integrated circuit such as a semiconductor memory device has a heavy load, the peak current is increased when a precharge voltage is abruptly supplied.

In order to solve the peak current problem, the precharge voltage may be provided in stages, or a following circuit for the precharge control may be used.

The following method according to an embodiment of the present invention solves the peak current problem that may occur in the operation of precharging the bit line.

FIG. 4 is a circuit diagram of the precharge control circuit 260 for precharging the bit line in stages in accordance with an embodiment of the present invention.

Referring to FIG. 4, the precharge control circuit 260 may include, inter alia, first to third switches SW1, SW2, SW3 and a level generator 261.

The first switch SW1 is coupled to receive a power supply voltage Vcc and provide an output to a node K1 in response to a first control signal. The second switch SW2 is coupled to the output node of the level generator 261 and provide an output to the node K1 in response to a second control signal. The third switch SW3 is coupled to a ground node and provide an output to the node K1 in response to a third control signal.

The first, second, and third control signals are generated by the control logic 250.

The level generator 261 generates and outputs a voltage aV that is lower than the power supply voltage Vcc but higher than the ground voltage. The voltage aV generated by the level generator 261 may be controlled by the control logic 250.

Figure 5A:
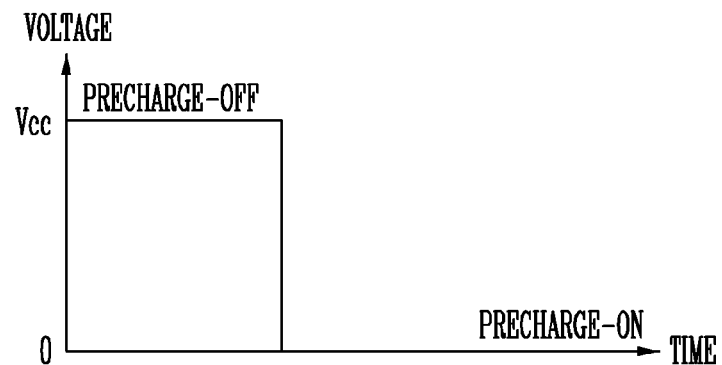
FIG. 5A shows a precharge control signal which is instantaneously changed by the precharge control circuit of FIG. 4.
Figure 5B:
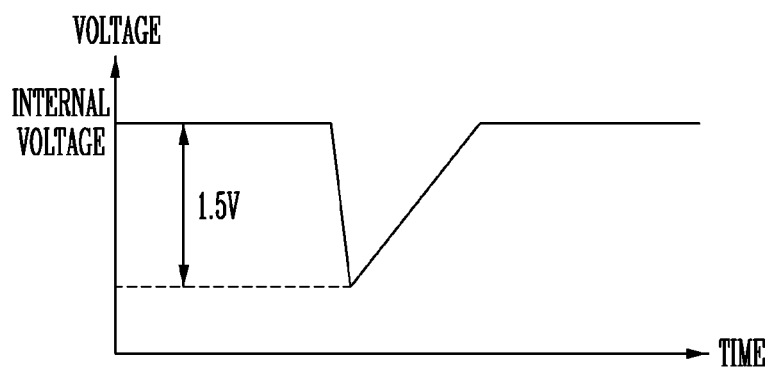
FIG. 5B shows a precharge control signal which is changed in stages by the precharge control circuit of FIG. 4.
Figure 5C:
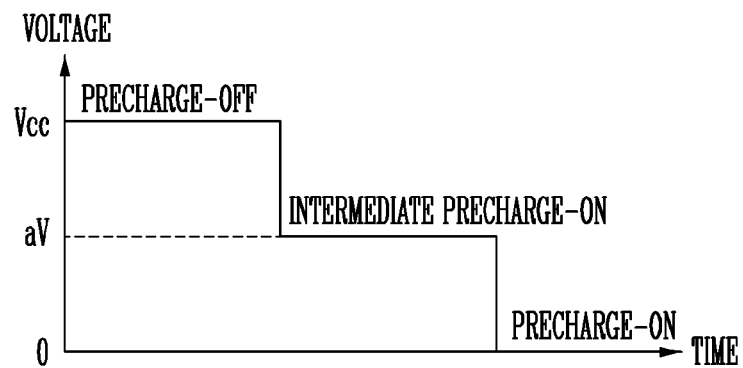
FIG. 5C shows the degree that an internal voltage drops in response to the precharge control signal, such as that shown in FIG. 5A.

FIGS. 5A and 5C show the examples of the precharge control signal PRECH that can be generated by the precharge control unit 260 shown in FIG. 4. Shown in FIG. 5A is the level of the precharge control signal PRECH that changes rather abruptly in time. Shown in FIG. 5C is the level of the precharge control signal PRECH that changes in stages in time.

Figure 5D:
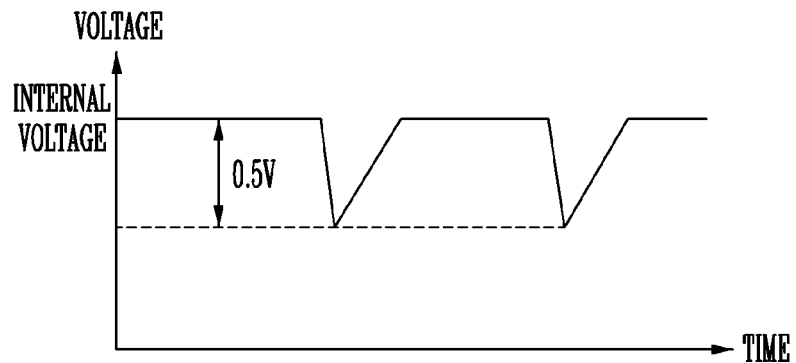
FIG. 5D shows the degree that an internal voltage drops in response to the precharge control signal, such as that shown in FIG. 5B.

Furthermore, FIG. 5B shows the degree of an internal voltage dropping in response to the precharge control signal PRECH shown in FIG. 5A, and FIG. 5D shows the degree of an internal voltage dropping in response to the precharge control signal PRECH shown in FIG. 5C.

FIGS. 5A-5D are described with reference to FIGS. 2-4.

In FIG. 5A, the first control signal from the control logic 250 is inputted at the beginning stage to the first switch SW1, which is turned on. The third control switch SW3 is then turned on in response to the third control signal from the control logic 250. Accordingly, the precharge control signal PRECH shifts from a high level to a low level in time.

When the precharge control signal PRECH shifts from a high level to a low level as shown in FIG. 5A, an internal voltage may drop, for example, by about 1.5 V as shown in FIG. 5B. It means that the peak current flow to precharge a bit line had risen by about 1.5 V.

In order to alleviate this problem, the precharge control signal PRECH having an intermediate step such as that shown in FIG. 5C may be used.

At the beginning stage, the precharge control signal PRECH remains in a high level in response to the first control signal of the control logic 250. When the second control signal is received from the control logic 250, the output voltage aV from the level generator 261 becomes the precharge control signal PRECH.

When the third control signal is received from the control logic 250, the node K1 is coupled to the ground node such that the precharge control signal PRECH would equal the ground voltage.

Accordingly, the precharge control signal PRECH changes from a high to an intermediate voltage level, and changes from the intermediate to a low voltage level. Accordingly, the degree of internal voltage drop in response to the precharge control signal of FIG. 5C (as shown in FIG. 5D) would be smaller than that would drop (as shown in FIG. 5B) in response to the precharge control signal PRECH of FIG. 5A. However, as shown in FIG. 5D, the voltage drop may repeatedly occur, because the output voltage aV of the level generator 261 must be controlled by taking into consideration the factors such as the ambient temperature and the power voltage shift.

As an option, a circuit for precharging a bit line may be further added; however, additional circuitry is problematic for increasing the size of the relevant semiconductor memory device.

For this reason, the apparatus according to an embodiment of the present disclosure utilizes a circuit for linearly and slowly changing the precharge control signal PRECH from a high level to a low level. Accordingly, the PMOS transistor (not shown) of the precharge unit 223 in the page buffer 221 in FIG. 3 is turned on linearly and slowly so that the precharge voltage is slowly inputted to the bit line. In this case, the rise of peak current can be prevented.

Figure 6:
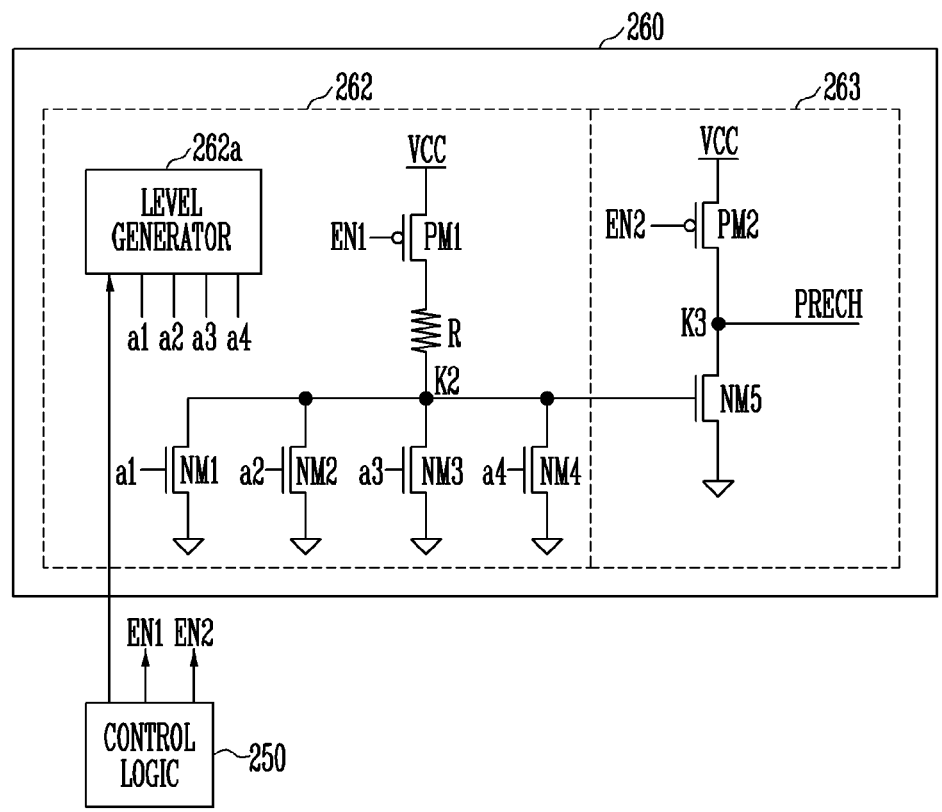
FIG. 6 is a detailed circuit diagram of the precharge control circuit according to an exemplary embodiment of this disclosure.

FIG. 6 is a detailed circuit diagram of the precharge control circuit 260 according to an exemplary embodiment of this disclosure.

Referring to FIG. 6, the precharge control circuit 260 for generating the precharge control signal PRECH includes a current control circuit 262 and a signal generator 263.

The current control circuit 262 includes a first PMOS transistor PM1, a resistor R, first to fourth NMOS transistors NM1 to NM4, and a level generator 262a.

The signal generator 263 includes a second PMOS transistor PM2 and a fifth NMOS transistor NM5.

The first PMOS transistor PM1 and the resistor R are coupled in series between the terminal for a power supply voltage Vcc and a node K2. A first enable signal EN1 is inputted to the gate of the first PMOS transistor PM1.

Each of the first to fourth NMOS transistors NM1 to NM4 is coupled between the node K2 and the ground node.

The level generator 262a generates a voltage set in response to the voltage control signal of the control logic 250. The level generator 262a generates first to fourth control voltages a1 to a4. The first to fourth control voltages a1 to a4 are inputted to the respective gates of the first to fourth NMOS transistors NM1 to NM4.

The level generator 262a outputs the voltage to some of or all the first to fourth control voltages a1 to a4 in response to the voltage control signal of the control logic 250. When the level generator 262a generates only the first control voltage a1, only the first NMOS transistor NM1 is turned on. When the level generator 262a generates only the first and second control voltages a1 and a2, only the first and second NMOS transistors NM1 and NM2 are turned on. When the level generator 262a generates all of the first to fourth control voltages a1 to a4, all of the first to fourth NMOS transistors NM1 to NM4 are turned on.

Alternatively, the level generator 262a may have one (or any predetermined number of) voltage output terminal(s). For example, the level generator 262a may have only one output voltage terminal to control the first to fourth NMOS transistors NM1 to NM4 to turn on by controlling the outputted voltage level. To do this, the threshold voltages for turning on the first to fourth NMOS transistors NM1 to NM4 must be set differently. The number of transistors to be turned-on may be controlled according to the output voltage level of the level generator 262a.

The node K2 is coupled to the gate of the fifth NMOS transistor NM5.

The second PMOS transistor PM2 and the fifth NMOS transistor NM5 are coupled in series between the terminal for a power supply voltage Vcc and the ground node. A second enable signal EN2 is inputted to the gate of the second PMOS transistor PM2.

The precharge control signal PRECH is outputted from the node K3 between the second PMOS transistor PM2 and the fifth NMOS transistor NM5.

The degree at which the fifth NMOS transistor NM5 of the signal generator 263 is turned on is controlled according to the output voltage of the current control circuit 262 of the precharge control circuit 260 according to an exemplary embodiment of the present invention.

During the time for which a precharge operation is not performed, the second enable signal EN2 of a low level is received from the control logic 250. In response to the low level second enable signal EN2, the second PMOS transistor PM2 is turned on, and the power supply voltage Vcc is provided to the node K3. The precharge control signal PRECH remains in a high level.

Referring to FIG. 3, when the precharge control signal PRECH is in a high level, the PMOS transistor of the precharge unit 223 of the page buffer 221 remains turned off.

In order to precharge the bit line, the control logic 250 generates the first enable signal EN1 of low level and the second enable signal EN2 of high level. The first PMOS transistor PM1 is turned on in response to the first enable signal EN1 of low level. One or more of the first to fourth NMOS transistors NM1 to NM4 are turned on according to the number of first to fourth control voltages a1 to a4 generated by the level generator 262a. Accordingly, the resistance of the first to fourth NMOS transistors NM1 to NM4 that are turned on and the voltages distributed by the resistor R are applied to the node K2. The fifth NMOS transistor NM5 is turned on according to the voltage at the node K2. The degree that the fifth NMOS transistor NM5 is turned on is varied according to the voltage at the node K2.

The second PMOS transistor PM2 is turned off in response to the second enable signal EN2 of high level.

When the second PMOS transistor PM2 is turned off, the voltage at the node K3 is discharged to the ground node through the fifth NMOS transistor N5.

The level generator 262a generates some or all of the first to fourth control voltages a1 to a4. The number of first to fourth control voltages a1 to a4 generated by the level generator 262a is controlled by the control logic 250.

Since a resistance value between the node K2 and the ground node is changed according to the number of first to fourth NMOS transistors NM1 to NM4 that are turned on, the voltage at the node K2 is changed. The degree that the fifth NMOS transistor NM5 is turned on is controlled according to the voltage at the node K2.

That is, the first to fourth NMOS transistors NM1 to NM4, together with the resistor R, play the role of a resistance component. Accordingly, the voltage of the node K2 is changed according to the number of first to fourth NMOS transistors NM1 to NM4 which are turned on.

When more number of the first to fourth NMOS transistors NM1 to NM4 are turned on, the resistance value between the node K2 and the ground node is reduced. When the resistance value between the node K2 and the ground node is reduced, the voltage at the node K2 drops. That is, the voltage at the node K2 drops as the number of first to fourth NMOS transistors NM1 to NM4 that are turned on increases.

With the voltage drop at the node K2, the degree that the fifth NMOS transistor NM5 is turned on is reduced. Accordingly, the speed that the voltage of the node K3 is discharged to the ground node becomes relatively slow.

The speed of the precharge signal PRECH shifting to a low level is controlled by the speed of the voltage at the node K3 discharging to the ground node. Here, the rate of the precharge signal PRECH shifting to a low level would be linear, when it is based on the voltage at the node K3 that is linearly discharged by the fifth NMOS transistor NM5. Then, the degree that the fifth NMOS transistor NM5 is turned on has to be changed according to the voltage at the node K2, and the fifth NMOS transistor NM5 has to prevent instantaneous discharging of the power supply voltage Vcc to the node K3. Accordingly, the fifth NMOS transistor NM5 is sized to be relatively smaller size than the sizes of the other transistors.

Furthermore, when the precharge signal PRECH slowly shifting to a low level is provided to the precharge unit 223, the degree that the PMOS transistor in the precharge unit 223 of the page buffer 221 is turned on is linearly increased. When the PMOS transistor in the precharge unit 223 is turned on linearly and slowly, the precharge voltage inputted to the bit line is slowly increased.

When the precharge voltage being slowly shifting to a low level is provided to the bit line, it acts to reduce the peak current occurring when the bit line is precharged.

Figure 7A:
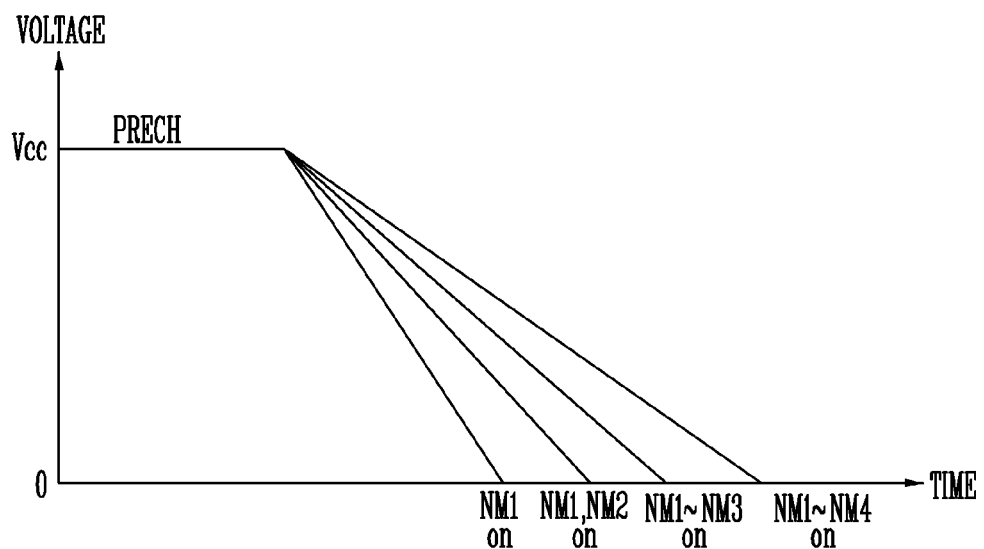
FIG. 7A is a graph showing the precharge control signal which is changed according to the number of transistors turned-on in the precharge control circuit.
Figure 7B:
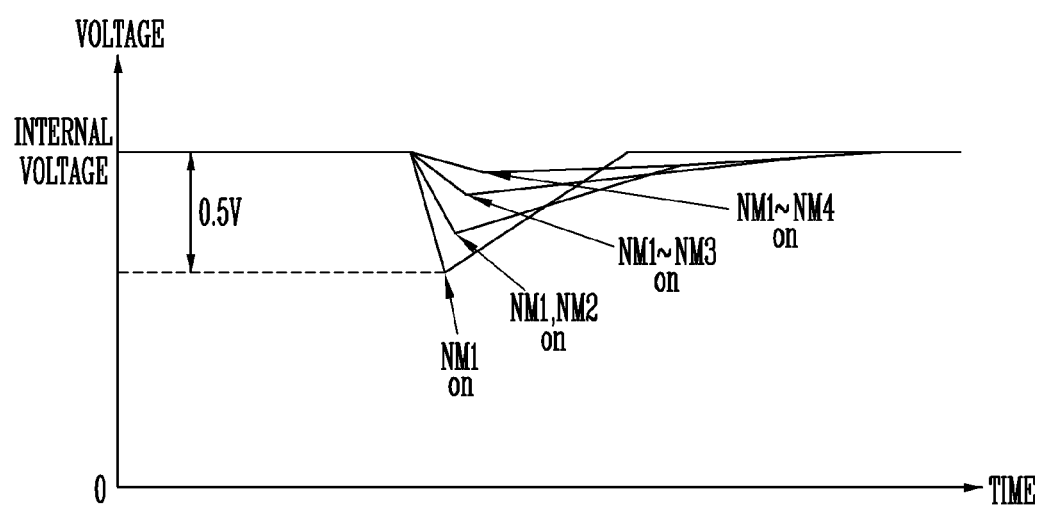
FIG. 7B shows the degree that an internal voltage drops when the precharge control signal, such as that shown in FIG. 7A, is received.

FIG. 7A is a graph showing the precharge control signal PRECH which is changed according to the number of NMOS transistors such as NM1, NM2, NM3, NM4 turned-on in the precharge control circuit 260, and FIG. 7B shows the degree of internal voltage dropping when the precharge control signal PRECH, such as that shown in FIG. 7A, is provided.

FIGS. 7A and 7B show a change of the precharge control signal PRECH and the voltage drop that would occur in relation to the number of first to fourth NMOS transistors NM1 to NM4 that are turned on.

If the control logic 250 controls the level generator 262a so that the level generator 262a generates only the first control voltage a1, only the first NMOS transistor NM1 is turned on. The voltage at the node K2 of the precharge control circuit 260 would be higher when only the first NMOS transistor NM1 is turned on than when two of the first to fourth NMOS transistors NM1 to NM4 are turned on.

Accordingly, the degree that the fifth NMOS transistor NM5 is turned on is increased, and the speed of the precharge control signal PRECH shifting to a low level becomes fast.

When the precharge control signal PRECH shifts to a low level more quickly, the voltage drop is increased by that much.

If the control logic 250 controls the level generator 262a to generate all of the first to fourth control voltages a1 to a4, it would turn on all of the first to fourth NMOS transistors NM1 to NM4. Accordingly, the voltage of the node K2 relatively drops, and the degree that the fifth NMOS transistor NM5 is turned on is reduced.

Consequently, the precharge control signal PRECH slowly shifts to a low level. With reduction in the speed that the precharge control signal PRECH shifts to a low level, the voltage drop is reduced.

As described with reference to FIGS. 7A-7B, as more number of the first to fourth NMOS transistors NM1 to NM4 are turned on, it reduces the speed that the precharge control signal PRECH shifts to a low level, and the degree that an internal voltage instantaneously drops is reduced.

Although FIG. 6 shows only four NMOS transistors NM1 to NM4, there can be more number of NMOS transistors between the node K2 and the ground node in order to further reduce the speed of the precharge control signal PRECH shifting to a low level.

If, as described above, the precharge control signal PRECH is controlled so that it would slowly shift to a low level, it can reduce the voltage drop when a voltage is supplied in order to precharge the bit line, and can also reduce the peak current.

The operation of controlling the precharge control signal PRECH is described in more detail below.

Figure 8:
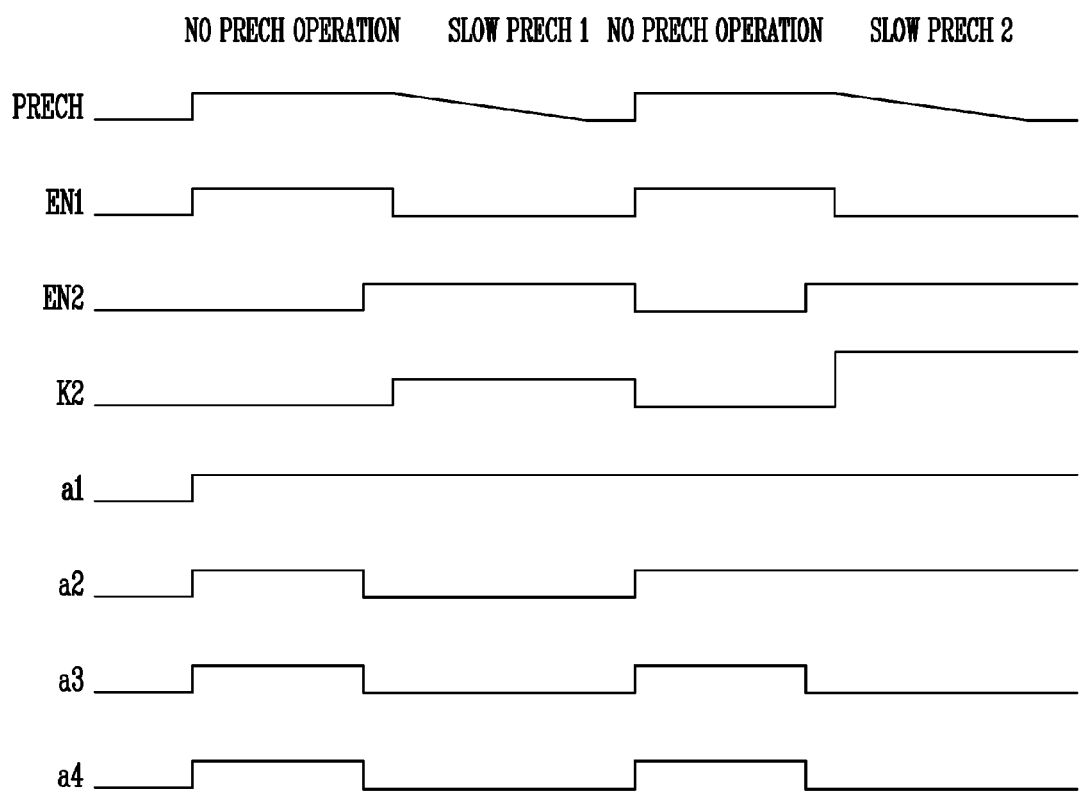
FIG. 8 shows a timing diagram illustrating signals and voltages for illustrating the operation of the precharge control circuit shown in FIG. 6.

FIG. 8 is a voltage timing diagram of various signals for the operation of the precharge control circuit 260 shown in FIG. 6 according to an embodiment of the present invention.

Referring to FIG. 8, during the time in which a precharge operation is not performed, the control logic 250 generates the first enable signal EN1 of high level and the second enable signal EN2 of low level.

Then, the second PMOS transistor PM2 of the signal generator 263 shown in FIG. 6 remains turned on, and thus the precharge control signal PRECH is set to a high level.

In order to output the precharge control signal PRECH, the voltage control signal of the control logic 250 is first inputted to the level generator 262a so as to control the operations of the first to fourth NMOS transistors NM1 to NM4.

Before starting a precharge operation, the control logic 250 turns on all of the first to fourth NMOS transistors NM1 to NM4. At an early stage of operation, it may not be needed to turn on all of the first to fourth NMOS transistors NM1 to NM4, but the first to fourth NMOS transistors NM1 to NM4 are turned on in order to prevent the voltage level of the precharge control signal PRECH from abruptly dropping.

To begin a precharge operation, the control logic 250 first shifts the second enable signal EN2 to a high level. In response thereto, the power supply voltage supplied to the node K3 is blocked, so that the precharge control signal PRECH would not remain in a high level any longer but would be discharged slowly.

Next, the control logic 250 shifts the first enable signal EN1 to a low level. In response thereto, the power supply voltage is supplied to the node K2. The control logic 250 inputs the voltage control signal for controlling the voltage of the node K2 to the level generator 262a.

The timing diagram shown in FIG. 8 is a timing diagram when only the first NMOS transistor NM1 is turned on. The control logic 250 outputs the voltage control signal to the level generator 262a so that only the first control voltage a1 of high level can be outputted.

Accordingly, the level generator 262a shifts the first control voltage a1 to a high level.

When the first enable signal EN1 shifts to a low level and the first control voltage a1 of high level is received, the first PMOS transistor PM1 and the first NMOS transistor NM1 are turned on. Accordingly, the voltage at the node K2 can be determined.

The degree that the fifth NMOS transistor NM5 is turned on is controlled according to the voltage at the node K2. Accordingly, the voltage at the node K3 is discharged.

That is, the precharge control signal PRECH would slowly drop (SLOW PRECH 1) as shown in FIG. 8.

FIG. 8 also shows that, for another precharge operation after performing a precharge operation, the precharge control signal PRECH in the second precharge operation is discharged in a different slope (SLOW PRECH 2) than the slope of the first precharge control signal (SLOW PRECH 1) when the precharge operation is performed again.

The control logic 250 generates the voltage control signal so that the first and second NMOS transistors NM1 and NM2 are turned on. Then, the voltage at the second node K2 rises, and the precharge control signal PRECH is discharged more quickly as shown in FIG. 8.

In order to control the voltage more finely at the second node K2, a variable resistor may be used instead of the resistor R shown in FIG. 6, and the precharge control circuit 260 may be configured so that the resistance value is controlled by the control logic 250.

Figure 9:
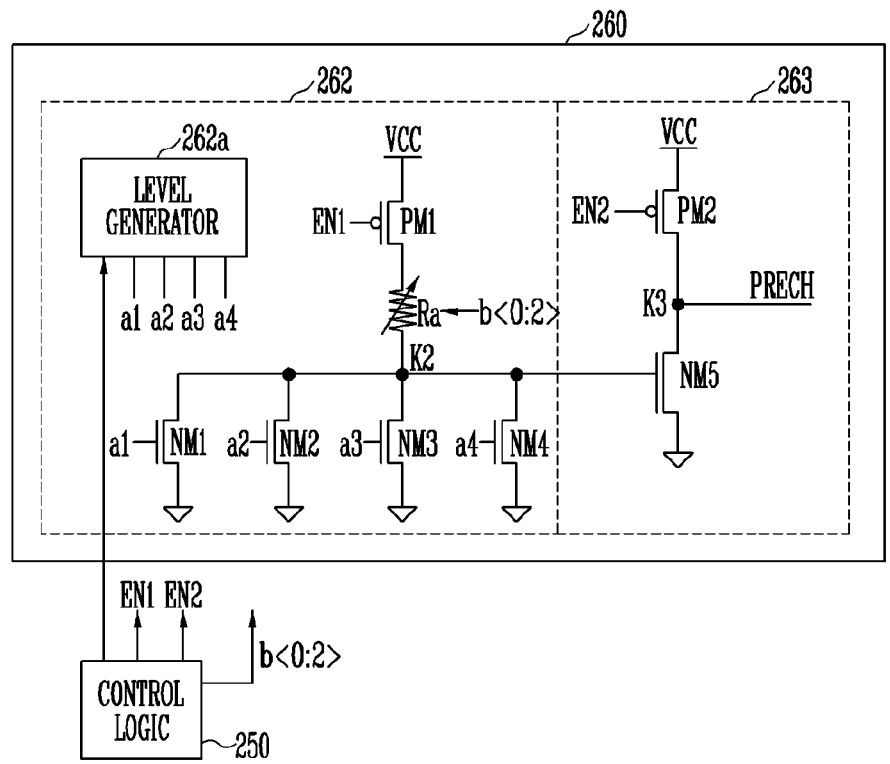
FIG. 9 is a circuit diagram of a precharge control circuit according to a second exemplary embodiment of this disclosure.

FIG. 9 is a circuit diagram of a precharge control circuit 260 according to another exemplary embodiment of this disclosure.

The related components shown in FIGS. 6 and 9 are assigned with same reference numerals.

In the precharge control circuit 260 according to an embodiment as shown in FIG. 9, a variable resistor Ra is used instead of the resistor R in FIG. 6, and the resistance value of the variable resistor Ra is changeable by the resistance control signals b<0:2>.

The resistance control signals b<0:2> are generated by the level generator 262a.

When the voltage control signal is received from the control logic 250, the level generator 262a generates the first to fourth control voltages a1 to a4 and the resistance control signals b<0:2> in order to control the second voltage of the node K2.

When the resistance value of the variable resistor Ra is changed in response to the resistance control signals b<0:2>, the second voltage of the node K2 is changed.

Accordingly, the second voltage of the second node K2 can be controlled more finely using only the first to fourth NMOS transistors NM1 to NM4.

Meanwhile, the control logic 250 may generate the voltage control signal in consideration of the shifts in the power supply voltage and temperature changes.

Figure 10:
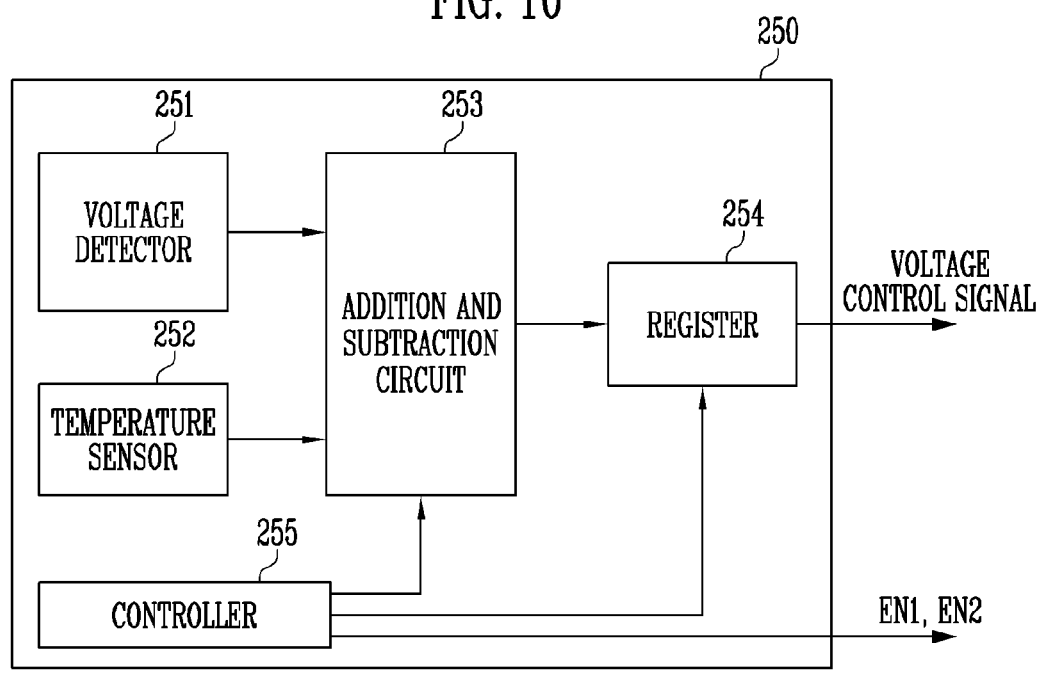
FIG. 10 is a simplified block diagram of a part of a control logic from which a voltage control signal is outputted.

FIG. 10 is a block diagram of a part in the control logic 250 that generates the voltage control signal.

Referring to FIG. 10, the control logic 250 includes a voltage detector 251, a temperature sensor 252, an addition and subtraction circuit 253, a register 254, and a controller 255.

The voltage detector 251 detects the power supply voltage drop in an integrated circuit such as a semiconductor memory device drops and generates a detection signal based on the detected result. A circuit for detecting the change of a reference voltage and the power supply voltage using a comparator may be used as the voltage detector 251.

The temperature sensor 252 generates a detection signal in response to the changes of ambient temperature.

The detection signals generated by the voltage detector 251 and the temperature sensor 252 are inputted to the addition and subtraction circuit 253. The addition and subtraction circuit 253 determines how quickly will the precharge control signal PRECH be discharged based on the detection signals and generates a voltage detection signal. The voltage detection signal is stored in the register 254.

The addition and subtraction circuit 253 generates a voltage control signal based on the changes in the voltage and temperature according to the characteristics of the transistors forming the precharge unit 223.

Referring to FIG. 3, the precharge unit 223 of the page buffer 221 in a semiconductor memory device according to an embodiment of the present invention includes a PMOS transistor (not shown) coupled between the terminal for a power supply voltage and the second sense node SO2. The degree that the PMOS transistor (not shown) in the precharge unit 223 is turned on according to the change in the power supply voltage and temperature may be changed. Accordingly, the precharge voltage inputted to the second sense node SO2 may be changed.

Accordingly, the addition and subtraction circuit 253 determines how quickly will the precharge control signal PRECH be discharged according to the voltage drop and the change of temperature by taking the characteristic of the PMOS transistor into consideration and generates the voltage control signal according to the determined result.

Now referring back to FIG. 10, the voltage control signal temporarily stored in the register 254 is outputted to the level generator 262a in response to a control signal generated by the controller 255.

The controller 255 generates the control signals for controlling the operations of the addition and subtraction circuit 253 and the register 254 and also generates the first and the second enable signals EN1 and EN2 when a precharge operation is performed.

The speed of the precharge control signal PRECH being discharged is controlled in response to the voltage control signal. In this regard, the precharge voltage can be flexibly provided according to the change in the ambient temperature and voltage.

As described above, the precharge control circuits according to an exemplary embodiment of this disclosure may be used to control the precharging of a bit line in a semiconductor memory device, but the same or similar circuits can be used in an integrated circuit for any circuit that needs to be precharged. In particular, the present invention can provide advantageous when it is utilized to a line or node with heavy load that must be precharged. Furthermore, since the precharge speed is controlled taking into consideration the changes in the ambient temperature and voltage, it can reduce the load, and the precharge operations can be more effectively performed.

As described above, in the precharge control circuit and the integrated circuit including the same according to various embodiments of the present invention, the precharge control signal is controlled so that a precharge voltage can be slowly supplied to a large circuit load for the circuit that is to be precharged in response to a precharge control signal. Accordingly, the peak current occurring in a precharge operation can be reduced.

What is claimed is:

1. A precharge control circuit, comprising:
    a precharge voltage supply unit configured to generate a precharge voltage based on a voltage level of a precharge control signal;
    a voltage generator configured to generate an operating voltage for controlling the voltage level of the precharge control signal in response to a first enable signal and a voltage control signal; and
    a signal generator capable of setting the precharge control signal to a specific voltage level in response to a second enable signal and capable of linearly changing the voltage level of the precharge control signal based on a slope, determined by a level of the operating voltage, when the second enable signal is disabled.

2. The precharge control circuit of claim 1, wherein the signal generator outputs the linearly decreasing voltage level of the precharge control signal according to the slope determined by the voltage level of the operating voltage.

3. The precharge control circuit of claim 1, wherein the voltage generator comprises:
    a level generator configured to generate one or more control signals in response to the voltage control signal;
    a first switching element coupled between a terminal for a power supply voltage and a first node and configured to be operated in response to the first enable signal; and
    a plurality of second switching elements coupled in parallel between the first node and a ground node and configured to be turned on in response to the one or more control signals.

4. The precharge control circuit of claim 3, wherein the voltage generator further comprises a variable resistor coupled between the first switching element and the first node, wherein a resistance value of the variable resistor is changeable in response to a resistance control signal generated by the level generator.

5. The precharge control circuit of claim 4, wherein the signal generator comprises:
    a third switching element coupled between the terminal for the power supply voltage and a second node and configured to be operated in response to the second enable signal; and
    a fourth switching element coupled between the second node and the ground node,
    wherein a degree that the fourth switching element is turned on is changed according to voltage of the first node,
    the precharge control signal is outputted from the second node, and
    a speed that the voltage level of the precharge control signal drops is changed according to the voltage of the first node.

6. The precharge control circuit of claim 5, wherein the speed of the voltage level of the precharge control signal dropping increases with increasing voltage level at the first node.

* * * * *